US008514613B1

(12) United States Patent
Lewis

(10) Patent No.: US 8,514,613 B1
(45) Date of Patent: Aug. 20, 2013

(54) MEMORY ELEMENTS WITH A CONFIGURABLE NUMBER OF PORTS

(75) Inventor: David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 153 days.

(21) Appl. No.: 13/167,496

(22) Filed: Jun. 23, 2011

(51) Int. Cl.
*G11C 11/00* (2006.01)

(52) U.S. Cl.
USPC ........ 365/154; 365/49.11; 365/177; 365/188; 365/189.011; 365/189.02; 365/189.15; 365/189.16; 365/202; 365/203; 365/207; 365/230.01; 365/230.02

(58) Field of Classification Search
USPC ............... 365/154, 49.11, 177, 188, 189.011, 365/189.02, 189.15, 189.16, 202, 203, 207, 365/230.01, 230.02
See application file for complete search history.

(56) References Cited

U.S. PATENT DOCUMENTS

| | | | |
|---|---|---|---|
| 6,388,939 B1 | 5/2002 | Manapat et al. | |
| 6,778,462 B1 * | 8/2004 | Castagnetti et al. | 365/230.05 |
| 7,359,275 B1 * | 4/2008 | Wu | 365/230.05 |
| 8,194,481 B2 * | 6/2012 | Pyeon | 365/200 |
| 8,259,524 B2 * | 9/2012 | Funane et al. | 365/210.14 |
| 2005/0024369 A1 * | 2/2005 | Xie | 345/547 |
| 2011/0026289 A1 | 2/2011 | Liaw | |
| 2012/0243285 A1 * | 9/2012 | Ngu et al. | 365/63 |

OTHER PUBLICATIONS

Rahim, U.S. Appl. No. 12/571,346, filed Sep. 30, 2009.

* cited by examiner

*Primary Examiner* — Fernando Hidalgo
(74) *Attorney, Agent, or Firm* — Treyz Law Group; Jason Tsai

(57) ABSTRACT

Integrated circuits may include configurable-port memory cells. The configurable-port memory cells may be operable in single-port mode and multiport mode. Each configurable-port memory cell may be coupled to first and second pairs of data lines. The configurable-port memory cell may include a first latching circuit having a first data storage node and a second latching circuit having a second data storage node. The first latching circuit may be coupled to the first pair of data lines through a first set of access transistors, whereas the second latching circuit may be coupled to the second pair of data lines through a second set of access transistors. An additional transistor may be coupled between the first and second data storage nodes. The configurable-port memory cell is configured in the single-port mode if the additional transistor is turned off and is configured in the dual-port mode if the additional transistor is turned on.

18 Claims, 4 Drawing Sheets

|  | MODE(S) OF OPERATION | |
|---|---|---|
| SINGLE PORT MODE | <u>200</u><br>8 WORDS<br>16 BITS | <u>202</u><br>16 WORDS<br>8 BITS |
| DUAL PORT MODE | <u>204</u><br>8 WORDS<br>8 BITS | |

FIG. 4

MEMORY ELEMENTS WITH A CONFIGURABLE NUMBER OF PORTS

BACKGROUND

Integrated circuits such as programmable integrated circuits may contain volatile memory elements in the form of static random access memory (SRAM) cells. In programmable integrated circuits, SRAM cells may serve as configuration random access memory (CRAM) cells. Programmable integrated circuits are a type of integrated circuit that can be programmed by a user to implement a desired custom logic function. CRAM cells are used to store configuration data supplied by the user. Once loaded, CRAM cells supply control signals to transistors to configure the transistors to implement the desired logic function.

Volatile memory elements such as SRAM and CRAM cells are typically based on cross-coupled inverters (i.e., latches). The memory elements are often arranged in arrays. In a typical array, data lines are used to write data into the memory elements and are used to read data from the memory elements that have been loaded with data. Address lines may be used to select which of the memory elements are being accessed.

A programmable integrated circuit typically contains memory circuitry having a mix of single-port memory elements and dual-port memory elements. The single-port memory elements can be used only as single-port memory elements, whereas the dual-port memory elements can be used as either single-port memory elements or dual-port memory elements. A certain number of the dual-port memory elements may be used as single-port memory elements during operation of the programmable integrated circuit, depending on the custom logic function defined by the user.

For example, consider a scenario in which the memory circuitry is used in a single-port mode. In the single-port mode, a large subset of the dual-port memory elements may be operated as single-port memory elements. As a result, a significant amount of hardware (i.e., hardware such as sense amplifiers and word line drivers that would have otherwise been used during dual-port operation) is not being used and is wasted when the dual-port memory elements are configured in the single-port mode.

SUMMARY

Integrated circuits such as programmable integrated circuits may include random access memory (RAM) cells that have a configurable number or ports. Such types of memory cells may be referred to as configurable-port memory cells.

Configurable-port memory cells may include a first latching circuit having first and second data storage nodes and a second latching circuit having third and fourth data storage nodes. The first and second latching (storage) circuits may be based on at least two cross-coupled inverters. The first latching circuit may be coupled to a first pair of data lines through a first set of access transistors, whereas the second latching circuit may be coupled to a second pair of data lines through a second set of access transistors.

A first transistor may be coupled between the first and second data storage nodes, whereas a second transistor may be coupled between the third and fourth data storage nodes. The first and second transistors may be controlled by a mode control signal. If the mode control signal is low (e.g., if the first and second transistors are turned off), the first and second latching circuits may each serve as a single-port memory cell. If the mode control signal is high (e.g., if the first and second transistors are turned on), the first and second latching circuits may collectively serve as one dual-port memory cell.

The first pair of data lines may be coupled to a first pair of write drivers and a first pair of sense amplifiers, whereas the second pair of data lines may be coupled to a second pair of write drivers and a second pair of sense amplifiers. At least one of the two pairs of write drivers and sense amplifiers may be switched into use during single-port operation, whereas only one of the two pairs of write drivers and sense amplifiers may be switched into use during dual-port operation.

If desired, the configurable-port memory cells may include more than two latching circuits to support tri-port operations, quad-port operations, etc.

Further features of the present invention, its nature and various advantages will be more apparent from the accompanying drawings and the following detailed description.

BRIEF DESCRIPTION OF THE DRAWINGS

FIG. 4 is a table showing different modes of operation for the configurable-port memory cell of FIG. 3 in accordance with an embodiment of the present invention.

DETAILED DESCRIPTION

Embodiments of the present invention relate to static random-access memory circuitry. The memory circuitry of the present invention may be used in any suitable integrated circuit. For example, the memory circuitry may be used in an integrated circuit memory device or an application specific integrated circuit (ASIC). The memory circuitry may also be used in a programmable logic device integrated circuit or a programmable integrated circuit of a type that is not traditionally referred to as a programmable logic device such as a digital signal processor containing programmable logic or a custom integrated circuit containing regions of programmable logic. The present invention will sometimes be described in the context of integrated circuits such as programmable logic device integrated circuits as an example.

Figure 1:
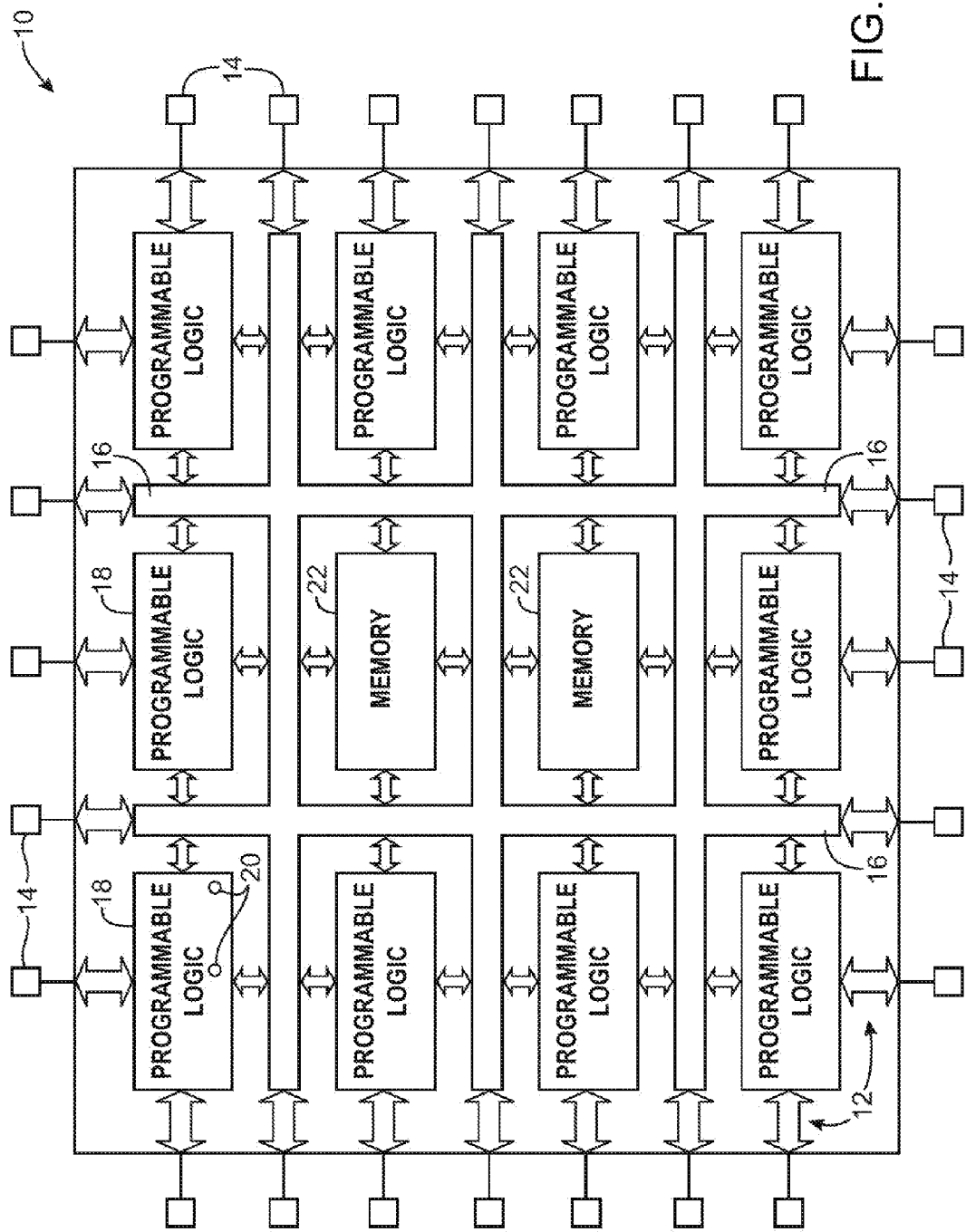
FIG. 1 is a diagram of an illustrative integrated circuit with memory element circuitry in accordance with an embodiment of the present invention.

An illustrative integrated circuit such as a programmable logic device 10 in accordance with the present invention is shown in FIG. 1. Programmable logic device 10 has input/output circuitry 12 for driving signals off of device 10 and for receiving signals from other devices via input/output pins 14. Interconnection resources 16 such as global and local vertical and horizontal conductive lines and busses may be used to route signals on device 10. Interconnection resource 16 include conductive lines and programmable connections between respective conductive lines and are therefore sometimes referred to as programmable interconnects 16.

Programmable logic device 10 contains programmable logic 18 and memory arrays 22. Memory arrays 22 may be operable in a single-port memory mode or multiport memory modes. Programmable logic 18 may include combinational and sequential logic circuitry. The programmable logic 18 may be configured to perform a custom logic function. The programmable interconnects 16 may be considered to be a type of programmable logic 18.

Programmable logic device 10 may contain programmable memory elements 20. Memory elements 20 can be loaded with configuration data (also called programming data) using pins 14 and input/output circuitry 12. Once loaded, the memory elements may each provide a corresponding static control output signal that controls the state of an associated logic component in programmable logic 18. Memory elements 20 may use any suitable volatile and/or non-volatile memory structures such as random-access-memory (RAM) cells, fuses, antifuses, programmable read-only-memory memory cells, mask-programmed and laser-programmed structures, etc. Because memory elements 20 are loaded with configuration data during programming, memory elements 20 are sometimes referred to as configuration memory.

Memory arrays 22 may contain volatile memory elements such as static random-access-memory (SRAM) cells. The memory arrays 22 are used to store data signals during normal operation of device 10. The memory arrays 22 (sometimes referred to as memory blocks) need not all be the same size. For example, small, medium, and large memory arrays 22 may be included on the same programmable logic device. There may, for example, be hundreds of small memory arrays each having a capacity of about 512 bits, two to nine large memory arrays each having a capacity of about half of a megabit, and an intermediate number of medium size memory arrays each having a capacity of about 4 kilobits to 8 kilobits. These are merely illustrative memory block sizes and quantities. In general, there may be any suitable size and number of memory arrays 22 on device 10. There may also be any suitable number of regions of programmable logic 18.

Each memory element 20 may be formed from a number of transistors configured to form a bistable circuit (i.e., a latch-type circuit). True and complement data storage nodes in the bistable circuit element can store corresponding true and complement versions of a data bit.

A bistable circuit element may be based on any suitable number of transistors. For example, the bistable portion of each memory element may be formed from cross-coupled inverters, from groups of multiple inverter-like circuits (e.g., in a distributed configuration that provides enhanced immunity from soft-error-upset events, etc.). Arrangements with bistable elements formed from cross-coupled inverter pairs are sometimes described herein as an example. This is, however, merely illustrative and is not intended to limit the scope of the present invention. Memory elements 20 may be formed using any suitable memory cell architecture.

With one suitable approach, complementary metal-oxide-semiconductor (CMOS) integrated circuit technology is used to form the memory elements 20, so CMOS-based memory element implementations are described herein as an example. If desired, other integrated circuit technologies may be used to form the memory elements and the integrated circuit in which the memory elements are used to form memory arrays.

The memory elements may be loaded from any suitable source of data. As an example, memory elements 20 may be loaded with configuration data from an external erasable-programmable read-only memory and control chip or other suitable data source via pins 14 and input/output circuitry 12. Loaded CRAM memory elements 20 may provide static control signals that are applied to the terminals (e.g., gates) of circuit elements (e.g., metal-oxide-semiconductor transistors) in programmable logic 18 to control those elements (e.g., to turn certain transistors on or off) and thereby configure the logic in programmable logic 18. The circuit elements may be transistors such as pass transistors, parts of multiplexers, look-up tables, logic arrays, AND, OR, NAND, and NOR logic gates, etc.

The memory elements 20 may be arranged in an array pattern. In a typical modern integrated circuit such as a programmable integrated circuit, there may be millions of memory elements 20 on each chip. During programming operations, the array of memory elements is provided with configuration data by a user (e.g., a logic designer). Once loaded with configuration data, the memory elements 20 produce static control signals at their outputs that selectively control portions of the circuitry in the programmable logic 18 and thereby customize its functions so that it will operate as desired.

The circuitry of device 10 may be organized using any suitable architecture. As an example, the logic of device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

When memory elements 20 are arranged in an array, horizontal and vertical conductors and associated loading circuitry may be used to load the memory elements with configuration data. Any suitable memory array architecture may be used for memory elements 20.

Figure 2:
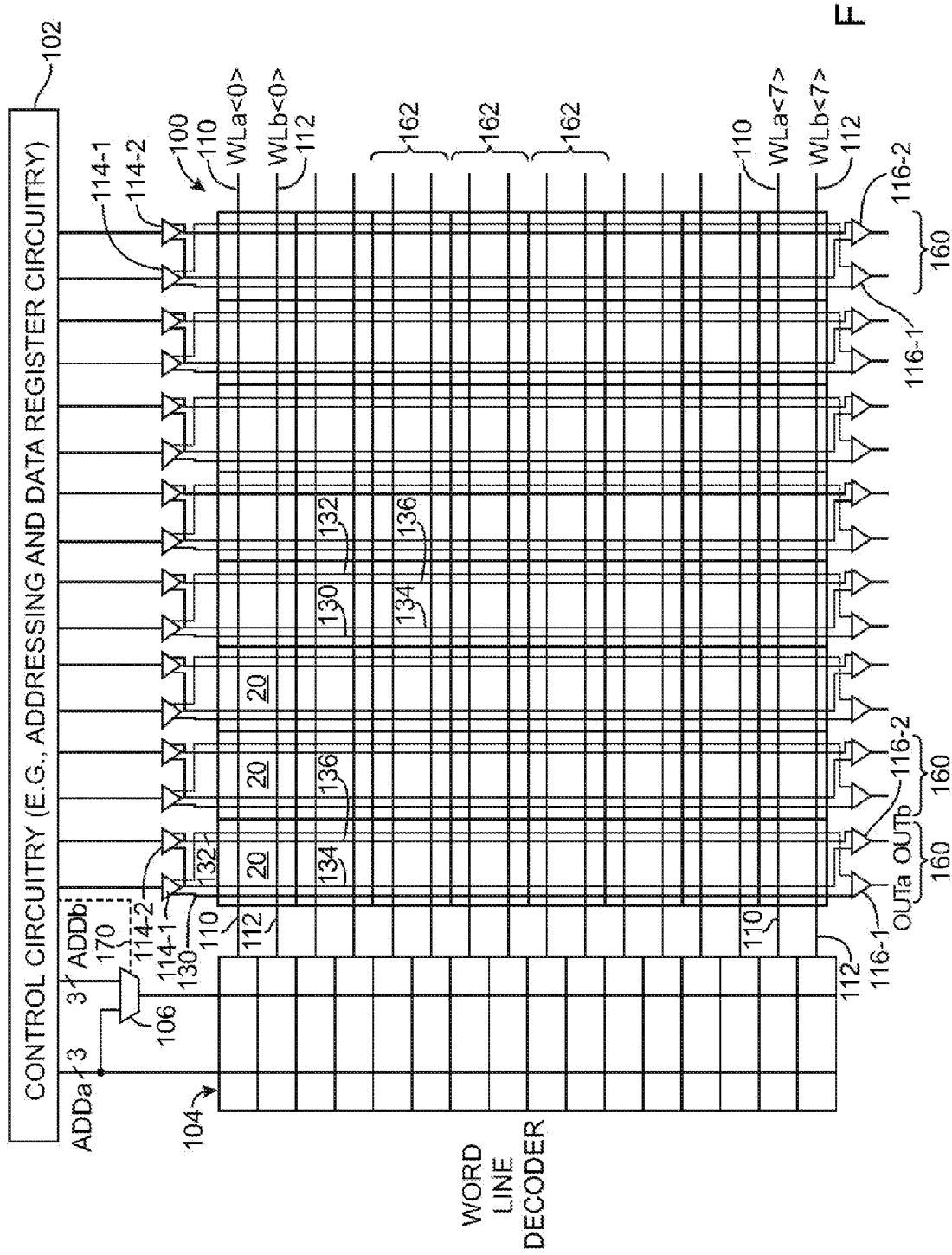
FIG. 2 is a diagram of an illustrative memory element array and associated control circuitry in accordance with an embodiment of the present invention.

FIG. 2 is a diagram of illustrative memory circuitry that includes memory elements (cells) 20 in accordance with one embodiment of the present invention.

Memory cells 20 may have a configurable number of ports and may sometimes be referred to as configurable-port memory elements. Memory cells 20 may, for example, be configured to operate in a single-port mode and a multiport mode. Cell 20 may include first and second storage (latching) portions. In the single-port mode, the first storage portion can store a single bit of data and the second storage portion can store an additional bit of data. In the dual-port mode, the first and second storage portions store identical data bits.

This ability of cell 20 to be configured in different modes allows programmable integrated circuit 10 to maximize memory hardware utility, functionality, and programmability. The configurability of cell 20 allows device 10 to provide more logic customizability in a given amount of area compared to the conventional programmable integrated circuit that contains a fixed number of single-port cells 21 and a fixed number of dual-port cells 23.

As shown in FIG. 2, the memory circuitry includes memory cell array 100, control circuitry 102, word line decoder 104, and other peripheral memory circuitry. Memory array 100 of FIG. 2 includes 64 memory cells 20 arranged in an eight-by-eight array (e.g., eight rows and eight columns of memory cells 20). This is merely illustrative. Device 10 may, for example, include thousands or millions of cells 20 arranged in an array of any suitable dimension (e.g., array 100 may include any desired number of cell rows and columns).

Control circuitry 102 may include column addressing circuitry, data register circuitry, and other control circuitry. Each cell column 160 may include a pair of associated write drivers 114-1 and 114-2 and a pair of associated sense amplifiers 116-1 and 116-2 (see, e.g., FIG. 2). Each write driver 114-1 may have differential outputs coupled to first data line 130 and second data line 132, whereas each write driver 114-2 may have differential outputs coupled to third data line 134 and fourth data line 136. Each sense amplifier 116-1 may have differential inputs coupled to first data line 130 and second data line 132, whereas each sense amplifier 116-2 may have differential inputs coupled to third data line 134 and fourth data line 136. Data lines 130, 132, 134, and 136 may sometimes be referred to as bit lines. Cells 20 in each column 160 may be coupled to data lines 130, 132, 134, and 136 associated with that cell column 160.

During data loading (write) operations, control circuitry 102 may be used to generate a desired pattern of write data for corresponding write drivers 114-1 and 114-2. These write drivers may be used during data loading operations to write the desired pattern of data into a selected row of cells 20. During read operations, the sense amplifiers may be used to determine whether each cell 20 in a selected row is currently storing a logic "1" or logic "0."

For example, if sense amplifier 116-1 outputs a high OUTa, the corresponding first latching portion of cell 20 is currently storing a logic "1" (e.g., data storage nodes Q and /Q of the first portion are respectively high and low). If sense amplifier 116-2 outputs a low OUTb, the corresponding second latching portion of cell 20 is currently storing a logic "0" (e.g., data storage nodes Q and /Q of the second portion are respectively low and high).

Word line decoder 104 may receive address signals from control circuitry 102. Decoder 104 may have a first input and a second input. The first input of decoder 104 may receive address signal ADDa from control circuitry 102. The second input of decoder 104 may receive either address signal ADDa or address signal ADDb through switching circuit (e.g., a multiplexer) 106. Multiplexer 106 may have a control input that receives a control signal 170 from control circuitry 102. Multiplexer 106 may be configured to route a selected one of signals ADDa and ADDb to its output depending on the value of the control signal 170 it receives at its control input.

In the example of FIG. 2, the address signals are each three-bit signals because a three-bit signal can be used to generate an eight-bit decoded signal for eight ($2^3$) corresponding cell rows 162. Only one of the eight bits in the decoded signal is asserted during normal operation of decoder 104. Consider another scenario in which there are ($2^6$) cell rows 162. This example, signals ADDa and ADDb will each be six-bit signals.

Each cell row 162 may receive first word line 110 and second word line 112. The decoded address signals may be conveyed over word lines 110 and 112. Word lines 110 and 112 may therefore sometimes be referred to as address lines, row control lines, etc. Word lines 110 and 112 may each receive a one-bit decoded signal associated with ADDa or ADDb, depending on the mode of operation of memory array 100.

Memory array 100 may be operable in single-port mode and multiport mode (e.g., dual-port mode). When array 100 is operated in the single-port mode, multiplexer 106 may be configured to route either signal ADDa or ADDb to its output. When array 100 is operated in the dual-port mode, multiplexer 106 may be configured to route signal ADDa to its output (e.g., signal ADDb is not used).

For example, memory array 100 may be operated in a first single-port mode, a second single-port mode, and a dual-port mode. The first cell row 162 may receive signals WLa<0> and WLb<0>, whereas eight cell row 162 may receive signals WLa<7> and WLb<7>. When array 100 is operated in the first single-port mode, WLa and WLb may have the same values. When array 100 is operated in the second single-port mode or the dual-port mode, WLa and WLb may have different values.

Figure 3:
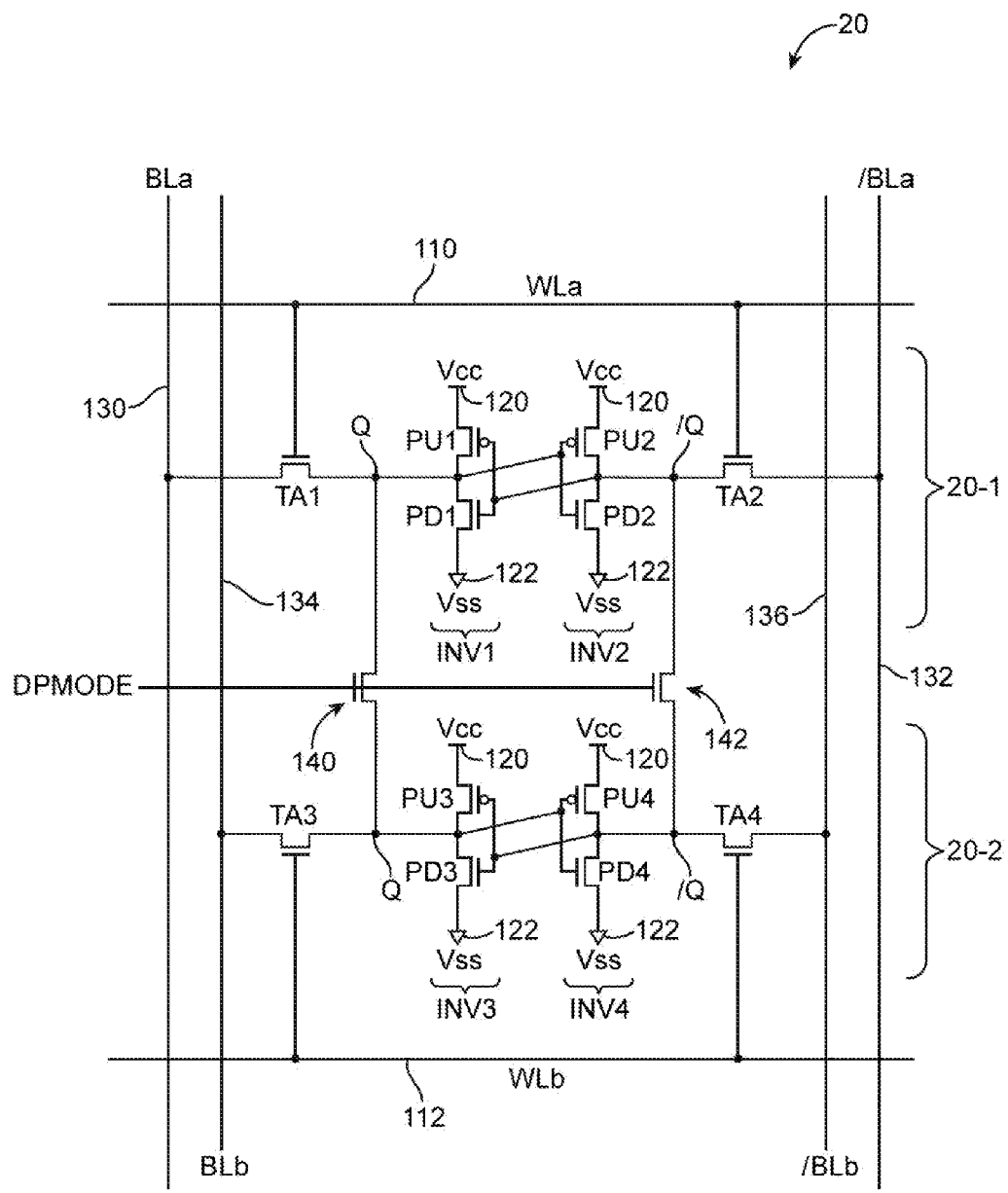
FIG. 3 is a circuit diagram of an illustrative configurable-port memory cell in accordance with an embodiment of the present invention.

FIG. 3 shows an exemplary detailed circuit diagram for memory cell 20 in accordance with one embodiment. As shown in FIG. 3, memory cell 20 may include first latching portion 20-1 and second latching portion 20-2. Latching (storage) portions 20-1 and 20-2 may each be a bistable circuit based on cross-coupled inverters.

Latching portion 20-1 may include cross-coupled inverters INV1 and INV2. Inverter INV1 may include p-channel pull-up transistor PU1 and n-channel pull-down transistor PD1 coupled in series between positive power supply line 120 (e.g., a positive power supply terminal on which positive power supply voltage Vcc is provided) and ground power supply line 122 (e.g., a ground power supply terminal on which ground power supply voltage Vss is provided). INV2 may include p-channel pull-up transistor PU2 and n-channel pull-down transistor PD2 coupled in series between power supply lines 120 and 122.

Inverters INV1 and INV2 may each have an input and an output. The output of INV1 may be coupled to the input of INV2 and may serve as a first data storage node Q for latching portion 20-1. The output of INV2 may be coupled to the input of INV1 and may serve as a second data storage node /Q for latching portion 20-1.

Latching portion 20-1 may further include access transistors TA1 and TA2. Access transistor TA1 may couple data storage node Q to data line 130 (e.g., a data line on which true bit line signal BLa is provided), whereas access transistor TA2 may couple data storage node /Q to data line 132 (e.g., a data line on which complement bit line signal /BLa is provided). Access transistors TA1 and TA2 may be controlled by address signal WLa (e.g., transistors TA1 and TA2 may have gates coupled to word line 110). The access transistors may therefore sometimes be referred to as address transistors.

Latching portion 20-2 may include cross-coupled inverters INV3 and INV4. Inverter INV3 may include p-channel pull-up transistor PU3 and n-channel pull-down transistor PD3 coupled in series between power supply lines 120 and 122. INV4 may include p-channel pull-up transistor PU4 and n-channel pull-down transistor PD4 coupled in series between power supply lines 120 and 122.

Inverters INV3 and INV4 may each have an input and an output. The output of INV3 may be coupled to the input of INV4 and may serve as a first data storage node Q for latching portion 20-2. The output of INV4 may be coupled to the input of INV3 and may serve as a second data storage node /Q for latching portion 20-2.

Latching portion 20-2 may further include access transistors TA3 and TA4. Access transistor TA3 may couple data storage node Q of portion 20-2 to data line 134 (e.g., a data line on which true bit line signal BLb is provided), whereas access transistor TA4 may couple data storage node /Q of portion 20-2 to data line 136 (e.g., a data line on which complement bit line signal /BLb is provided). Access transistors TA3 and TA4 may be controlled by address signal WLb (e.g., transistors TA3 and TA4 may have gates coupled to word line 112). If desired, latching portions 20-1 and 20-2 may be formed using more than two inverters, using at least two inverter-like circuits, or using other suitable latching structures to provide desired read/write margins, soft error immunity, etc.

Memory cell 20 may include linking transistors such as n-channel transistors 140 and 142. As shown in FIG. 3, transistor 140 couples storage node Q of latching circuit 20-1 to storage node Q of latching circuit 20-2, whereas transistor 142 couples storage node /Q of latching circuit 20-1 to storage node /Q of latching circuit 20-2. Transistors 140 and 142 may be controlled by signal DPMODE (e.g., transistors 140 and 142 may each have a gate that receives signal DPMODE). Signal DPMODE may be generated by control circuitry 102.

As mentioned previously, cell 20 may be operable in a first single-port mode, a second single-port mode, a dual-port mode, and other modes of operation. If signal DPMODE is low, cell 20 is configured to operate in the first or second single-port mode (e.g., transistors 140 and 142 are disabled to isolate bistable circuits 20-1 and 20-2 so that circuits 20-1 and 20-2 form two separate memory elements each having only one port). If signal DPMODE is high, cell 20 is configured to operate in the dual-port mode (e.g., transistors 140 and 142 are enabled to link bistable circuits 20-1 and 20-2 so that circuits 20-1 and 20-1 are combined to form one memory element having at least two ports).

FIG. 4 illustrates different modes of operation for memory cell 20 in accordance with one embodiment of the present invention. When memory array 100 of FIG. 2 is configured in the single-port mode (e.g., when signal DPMODE is low), array 100 may be grouped into eight words of 16 bits (mode 200) or 16 words of eight bits (mode 202), as examples. For operation in mode 200, word lines 110 and 112 may be driven by the same set of address signals (e.g., decoder 104 may be driven by routing the same address signals to both address buses or multiplexer 106 may be configured to route signal ADDa to its output). Control logic causes both WLa and WLb to be asserted in one row for the selected word in this mode. In this scenario, latching portions 20-1 and 20-2 will each behave as a single-port memory cell and will be simultaneously selected during read/write operations (e.g., the 16 sense amplifiers will all be in use during read operations, whereas the 16 write drivers will all be in use during write operations).

For operation in mode 202, one of word lines 110 or 112 is asserted in a given clock cycle. An additional address bit (e.g., a fourth bit) may be required in ADDa to select between enabling WLa and WLb in this configuration. For example, the fourth address signal in ADDa may be used to enable WLa for even numbered words and to enable WLb for odd numbered words. For example, if a selected one of word line signals WLa is asserted while word line signals WLb are all deasserted, then only latching portions 20-1 in the row corresponding to asserted WLa and the associated read/write circuitry will be in use during read/write operations (e.g., eight sense amplifiers 116-1 will be in use during read operations, whereas eight write drivers 114-1 will be in use during write operations). If a selected one of word line signals WLb is asserted (e.g., multiplexer 106 routes signal ADDb to its output) while word line signals WLa are all deasserted, then only latching portions 20-2 in the row corresponding to asserted WLb and the associated read/write circuitry will be in use during read/write operations (e.g., eight sense amplifiers 116-2 will be in use during read operations, whereas eight write drivers 114-2 will be in use during write operations).

When memory array 100 of FIG. 2 is configured in the dual-port mode (e.g., when signal DPMODE is high), array 100 may be grouped into eight words of eight bits (mode 204), as an example. In this scenario, latching portions 20-1 and 20-2 will behave as a single dual-port memory cell (e.g., storage node Q of portions 20-1 and 20-2 will store the true version of a given data bit, where storage node /Q of portions 20-1 and 20-2 will store the inverted version of the given data bit).

For operation in mode 204, either words lines 110 or 112 may are in use. For example, if only word lines 110 are in use, write drivers 114-1 will be active during data loading operations, whereas sense amplifiers 116-1 will be active during data reading operations. If only word lines 112 are in use, write drivers 114-2 will be active during data loading operations, whereas sense amplifiers 116-2 will be active during data reading operations (as examples).

The examples described herein are merely illustrative. Modes 200, 202, and 204 may be applicable for memory array 100 of any size and dimension.

Forming device 10 with configurable-port memory cells 20 may provide increased efficiency for applications that use single-port memory cells. Cell 20 includes six more transistors than conventional dual-port cell 23 (FIG. 3) while using the same number of peripheral circuits (i.e., the same number of write drivers and sense amplifiers). When array 100 is operated in the single-port modes, however, array 100 provides twice as many bits as a conventional dual-port memory array with the same number of peripheral circuits at a small cost of having seven transistors per bit (the 14 transistors in cell 20 divided by two) instead or six transistors per bit for cell 21 (FIG. 2). In other words, array 100 of cells 20 having a configurable number of ports provides nearly twice the memory density compared to conventional dual port memory arrays when array 100 is configured in the single-port modes.

The foregoing is merely illustrative of the principles of this invention and various modifications can be made by those skilled in the art without departing from the scope and spirit of the invention.

What is claimed is:

1. Memory element circuitry comprising:
   a first bistable storage element;
   a second bistable storage element, wherein the first and second bistable storage elements are linked and form one memory element having at least two ports in a first mode and wherein the first and second bistable storage elements are isolated and form two separate memory elements in a second mode that is different than the first mode; and
   at least one linking circuit operable to couple the first bistable storage element to the second bistable storage element, wherein the linking circuit is enabled during the first mode and wherein the linking circuit is disabled during the second mode.

2. The memory element circuitry defined in claim 1 wherein the at least one linking circuit comprises a transistor.

3. The memory element circuitry defined in claim 1, wherein the at least one linking circuit comprises an n-channel transistor.

4. The memory element circuitry defined in claim 1 further comprising:
   a first pair of data lines;
   a second pair of data lines;
   a first set of access transistors operable to couple the first bistable storage element to the first pair of data lines; and
   a second set of access transistors operable to couple the second bistable storage element to the second pair of data lines.

5. The memory element circuitry defined in claim 4 further comprising:
   a first driver circuit having outputs coupled to the first pair of data lines;
   a second driver circuit having outputs coupled to the second pair of data lines;
   a first amplifier circuit having inputs coupled to the first pair of data lines; and a second amplifier circuit having inputs coupled to the second pair of data lines.

6. The memory element circuitry defined in claim 4 further comprising:
control circuitry operable to generate address signals;
a decoder operable to receive the address signals and further operable to generate decoded address signals for the first and second set of access transistors; and
a multiplexing circuit coupled between the control circuitry and the decoder.

7. Memory element circuitry operable in a first mode and a second mode, said memory element circuitry comprising:
a storage element operable to store only one data bit in the first mode and to store at least two data bits in the second mode, wherein the storage element comprises a first bistable circuit having a first data storage node and a second bistable circuit having a second data storage node; and
a transistor coupled between the first data storage node and the second data storage node, wherein the transistor is operable to combine the first and second bistable circuit into one multiport memory element in the first mode and is further operable to isolate the first and second bistable circuits in the second mode.

8. The memory element circuitry defined in claim 7, wherein the storage element is configured to operate as two single-port memory cells in the second mode.

9. The memory element circuitry defined in claim 7 further comprising:
a first pair of data lines;
a second pair of data lines;
a first set of access transistors operable to couple the first bistable circuit to the first pair of data lines; and
a second set of access transistors operable to couple the second bistable circuit to the second pair of data lines.

10. The memory element circuitry defined 9 further comprising:
a first write driver having outputs coupled to the first pair of data lines;
a second write driver having outputs coupled to the second pair of data lines;
a first sense amplifier having inputs coupled to the first pair of data lines; and
a second sense amplifier having inputs coupled to the second pair of data lines.

11. The memory element circuitry defined in claim 10 further comprising:
control circuitry operable to generate address signals;
a decoder operable to receive the address signals and further operable to generate decoded address signals for the first and second set of access transistors; and
a multiplexer interposed between the control circuitry and the decoder.

12. The memory element circuitry defined in claim 7, wherein the transistor comprises an n-channel transistor.

13. A storage element operable in a first mode and a second mode that is different from the first mode, comprising:
a first latching circuit having a first data storage node;
a second latching circuit having a second data storage node; and
a switch operable to combine the first and second latching circuits during the first mode and to isolate the first and second latching circuits during the second mode, wherein the switch is coupled between the first data storage node and the second data storage node.

14. The storage element defined in claim 13, wherein the first latching circuit further comprises a third data storage node, wherein the second latching circuit further comprises a fourth data storage node, and wherein the storage element further comprises:
an additional switch operable to combine the first and second latching circuits during the first mode and to isolate the first and second latching circuits during the second mode, wherein the additional switch is coupled between the third data storage node and the fourth data storage node.

15. The storage element defined in claim 14, wherein the switch and the additional switch comprise n-channel transistors.

16. The storage element defined in claim 13 further comprising:
a first set of access transistors coupled to the first latching circuit; and
a second set of access transistors coupled to the second latching circuit, wherein the first set of access transistors forms a first port for the storage element and wherein the second set of access transistors forms a second port for the storage element.

17. A memory element operable in first and second modes, comprising:
a first latching circuit having first and second data storage nodes;
a second latching circuit having third and fourth data storage nodes;
a first coupling circuit connected between the first data storage node and the third data storage node; and
a second coupling circuit connected between the second data storage node and the fourth data storage node, wherein the first and second coupling circuits are turned on during the first mode and are turned off during the second mode.

18. The memory element defined in claim 17 further comprising:
a first pair of data lines;
a second pair of data lines;
a first set of access transistors operable to couple the first latching circuit to the first pair of data lines; and
a second set of access transistors operable to couple the second latching circuit to the second pair of data lines, wherein the first and second coupling circuits comprise transistors.

* * * * *